(12) United States Patent
Roy et al.

(10) Patent No.: US 10,446,499 B2
(45) Date of Patent: Oct. 15, 2019

(54) HIGH DENSITY INTERCONNECT DEVICE AND METHOD

(71) Applicant: Intel Corporation, Santa Clara, CA (US)

(72) Inventors: Mihir K Roy, Chandler, AZ (US); Mathew J Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 83 days.

(21) Appl. No.: 15/438,321

(22) Filed: Feb. 21, 2017

(65) Prior Publication Data

US 2017/0162509 A1    Jun. 8, 2017

Related U.S. Application Data

(60) Division of application No. 14/518,421, filed on Oct. 20, 2014, now abandoned, which is a continuation of
(Continued)

(51) Int. Cl.
*H01L 23/13*    (2006.01)
*H01L 21/48*    (2006.01)
(Continued)

(52) U.S. Cl.
CPC ...... *H01L 23/5386* (2013.01); *H01L 21/4853* (2013.01); *H01L 21/4857* (2013.01);
(Continued)

(58) Field of Classification Search
CPC ............ H01L 21/4853; H01L 21/5381; H01L 21/5385; H01L 21/5386; H01L 2924/1434;
(Continued)

(56) References Cited

U.S. PATENT DOCUMENTS 6,627,978 B2    9/2003  Dujari et al.
8,064,224 B2   11/2011  Mahajan et al.
(Continued)

FOREIGN PATENT DOCUMENTS

CN    1790657 A    6/2006
CN    1835229 A    9/2006
(Continued)

OTHER PUBLICATIONS

"Chinese Application Serial No. 201310705286.9, Decision of Rejection dated Aug. 25, 2017", no translation, 12 pgs.
(Continued)

*Primary Examiner* — Matthew E Warren
(74) *Attorney, Agent, or Firm* — Schwegman Lundberg & Woessner, P.A.

(57) ABSTRACT

Embodiments that allow both high density and low density interconnection between microelectronic die and motherboard via Direct Chip Attach (DCA) are described. In some embodiments, microelectronic die have a high density interconnect with a small bump pitch located along one edge and a lower density connection region with a larger bump pitch located in other regions of the die. The high density interconnect regions between die are interconnected using an interconnecting bridge made out of a material that can support high density interconnect manufactured into it, such as silicon. The lower density connection regions are used to attach interconnected die directly to a board using DCA. The high density interconnect can utilize current Controlled Collapsed Chip Connection (C4) spacing when interconnecting die with an interconnecting bridge, while allowing much larger spacing on circuit boards.

6 Claims, 3 Drawing Sheets

Related U.S. Application Data application No. 13/722,128, filed on Dec. 20, 2012, now Pat. No. 8,866,308.

(51) Int. Cl.

| | |
|---|---|
| *H01L 23/14* | (2006.01) |
| *H01L 23/538* | (2006.01) |
| *H01L 23/00* | (2006.01) |
| *H01L 25/00* | (2006.01) |
| *H01L 25/065* | (2006.01) |
| *H01L 25/18* | (2006.01) |

(52) U.S. Cl.
CPC .......... *H01L 23/13* (2013.01); *H01L 23/5381* (2013.01); *H01L 23/5383* (2013.01); *H01L 23/5385* (2013.01); *H01L 24/14* (2013.01); *H01L 24/17* (2013.01); *H01L 24/25* (2013.01); *H01L 24/81* (2013.01); *H01L 25/0655* (2013.01); *H01L 25/18* (2013.01); *H01L 25/50* (2013.01); *H01L 23/147* (2013.01); *H01L 24/13* (2013.01); *H01L 2224/13101* (2013.01); *H01L 2224/1412* (2013.01); *H01L 2224/14505* (2013.01); *H01L 2224/16225* (2013.01); *H01L 2224/16238* (2013.01); *H01L 2224/1712* (2013.01); *H01L 2224/24146* (2013.01); *H01L 2224/2541* (2013.01); *H01L 2224/81193* (2013.01); *H01L 2224/81203* (2013.01); *H01L 2224/81815* (2013.01); *H01L 2224/81986* (2013.01); *H01L 2924/12042* (2013.01); *H01L 2924/1432* (2013.01); *H01L 2924/1434* (2013.01); *H01L 2924/14335* (2013.01); *H01L 2924/15153* (2013.01); *H01L 2924/15747* (2013.01); *H01L 2924/381* (2013.01)

(58) Field of Classification Search
CPC . H01L 2924/15153; H01L 2924/15747; H01L 2924/381; H01L 2224/16238; H01L 2224/81193; H01L 2224/81203; H01L 2224/81815; H01L 24/81; H01L 23/12; H01L 23/13; H01L 23/147; H01L 23/49822; H01L 21/5383
See application file for complete search history.

(56) References Cited

U.S. PATENT DOCUMENTS

| | | | |
|---|---|---|---|
| 8,227,904 B2 | 7/2012 | Braunisch et al. | |
| 8,866,308 B2 | 10/2014 | Roy et al. | |
| 2004/0036152 A1 | 2/2004 | Harper et al. | |
| 2005/0133930 A1* | 6/2005 | Savastisuk | H01L 23/147 257/774 |
| 2005/0263867 A1* | 12/2005 | Kambe | H01L 23/49822 257/678 |
| 2010/0327424 A1* | 12/2010 | Braunisch | H01L 23/13 257/692 |
| 2011/0215472 A1* | 9/2011 | Chandrasekaran | H01L 24/73 257/738 |
| 2013/0214410 A1* | 8/2013 | Khan | H01L 23/12 257/738 |
| 2014/0175636 A1 | 6/2014 | Roy et al. | |
| 2015/0035144 A1 | 2/2015 | Roy et al. | |

FOREIGN PATENT DOCUMENTS

| | | |
|---|---|---|
| CN | 101960589 A | 1/2011 |
| CN | 102460690 A | 5/2012 |
| CN | 103887289 A | 6/2014 |
| JP | 4380130 B2 | 12/2009 |
| KR | 1020100116689 A | 11/2010 |
| KR | 1020120018810 A | 3/2015 |
| KR | 101642338 B1 | 7/2016 |

OTHER PUBLICATIONS

"U.S. Appl. No. 14/518,421, Preliminary Amendment filed Nov. 14, 2014", 7 pgs.
"U.S. Appl. No. 14/518,421, Response filed Feb. 5, 2015 to Restriction Requirement dated Dec. 5, 2014", 9 pgs.
"U.S. Appl. No. 14/518,421, Response filed Apr. 29, 2016 to Non Final Office Action dated Jan. 29, 2016", 9 pgs.
"U.S. Appl. No. 14/518,421, Response filed Oct. 12, 2015 to Non Final Office Action dated Jun. 11, 2015", 10 pgs.
"U.S. Appl. No. 14/518,421, Restriction Requirement dated Dec. 5, 2014", 7 pgs.
"Chinese Application Serial No. 201310705286.9, Office Action dated Feb. 1, 2016", w/ English Translation, 29 pgs.
"Chinese Application Serial No. 201310705286.9, Office Action dated Mar. 2, 2017", Without English Translation, 12 pgs.
"Chinese Application Serial No. 201310705286.9, Office Action dated Sep. 1, 2016", Without English Translation, 14 pgs.
"Chinese Application Serial No. 201310705286.9, Response filed May 17, 2017 to Office Action dated Mar. 2, 2017", w/ English Claims, 16 pgs.
"Chinese Application Serial No. 201310705286.9, Response filed Jun. 16, 2016 to Office Action dated Feb. 1, 2016", with English translation of claims, 16 pgs.
"Chinese Application Serial No. 201310705286.9, Response filed Nov. 16, 2016 to Office Action dated Sep. 1, 2016", W/English Claims, 16 pgs.
"Korean Application Serial No. 10-2013-160321, Notice of Preliminary Rejection dated Sep. 25, 2015", with concise explanation of relevance, 4 pgs.
"Korean Application Serial No. 10-2013-160321, Office Action dated Dec. 1, 2015", w/ English Translation, 3 pgs.
"Korean Application Serial No. 10-2013-160321, Response filed Feb. 1, 2016 to Office Action dated Dec. 1, 2015", w/ English Claims, 15 pgs.
"Korean Application Serial No. 10-2013-160321, Response filed Oct. 30, 2015 to Notice of Preliminary Rejection dated Sep. 25, 2015", w/ English Claims, 17 pgs.
"Korean Application Serial No. 10-2016-0090482, Final Office Action dated Apr. 25, 2017", w/ English Summary, 6 pgs.
"Korean Application Serial No. 10-2016-0090482, Office Action dated Oct. 1, 2016", Without English Translation, 7 pgs.
"Korean Application Serial No. 10-2016-0090482, Response filed Dec. 1, 2016 to Office Action dated Oct. 1, 2016", W/English Claims, 19 pgs.
"U.S. Appl. No. 13/722,128, Non Final Office Action dated Jan. 3, 2014", 11 pgs.
"U.S. Appl. No. 13/722,128, Notice of Allowance dated Jun. 9, 2014", 9 pgs.
"U.S. Appl. No. 13/722,128, Response filed Apr. 3, 2014 to Non Final Office Action dated Jan. 3, 2014", 8 pgs.
"U.S. Appl. No. 14/518,421, Final Office Action dated Sep. 20, 2016", 15 pgs.
"U.S. Appl. No. 14/518,421, Non Final Office Action dated Jan. 29, 2016", 12 pgs.
"U.S. Appl. No. 14/518,421, Non Final Office Action dated Jun. 11, 2015", 13 pgs.

\* cited by examiner

HIGH DENSITY INTERCONNECT DEVICE AND METHOD

This application is a divisional of U.S. application Ser. No. 14/518,421, filed. Oct. 20, 2014, which is a continuation of U.S. patent application Ser. No. 13/722,128, filed on Dec. 20, 2012, now issued as U.S. Pat. No. 8,866,308, all of which are incorporated herein by reference in their entirety.

TECHNICAL FIELD

Embodiments pertain to integrated circuit GC) dies, die packages, and associated methods. More particularly, embodiments pertain to using an interconnecting bridge such as a silicon bridge to interconnect dies with a high density interconnect.

BACKGROUND

Direct Chip Attach (DCA) on board is a concept that may allow significant cost savings by eliminating the package. However, board design rules have not scaled at the same rate as Controlled Collapsed Chip Connection (C4) bump pitch. Thus, in order to use DCA, the bump pitch of the chip die needs to be large enough to accommodate the board design rules, and that size bump pitch would be much larger than current technology allows for dies. This limits the number of interconnects that may be made using DCA.

As long as the bump pitch of the die is large enough to accommodate the board pad size and the line/space rules, DCA remains an attractive solution. However, in the System On Chip (SOC) area and in other high density interconnect applications, DCA is yet to be considered due to the mismatch between the C4 bump pitch scaling of current generation SOC die and the board pad size and line/space rules.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
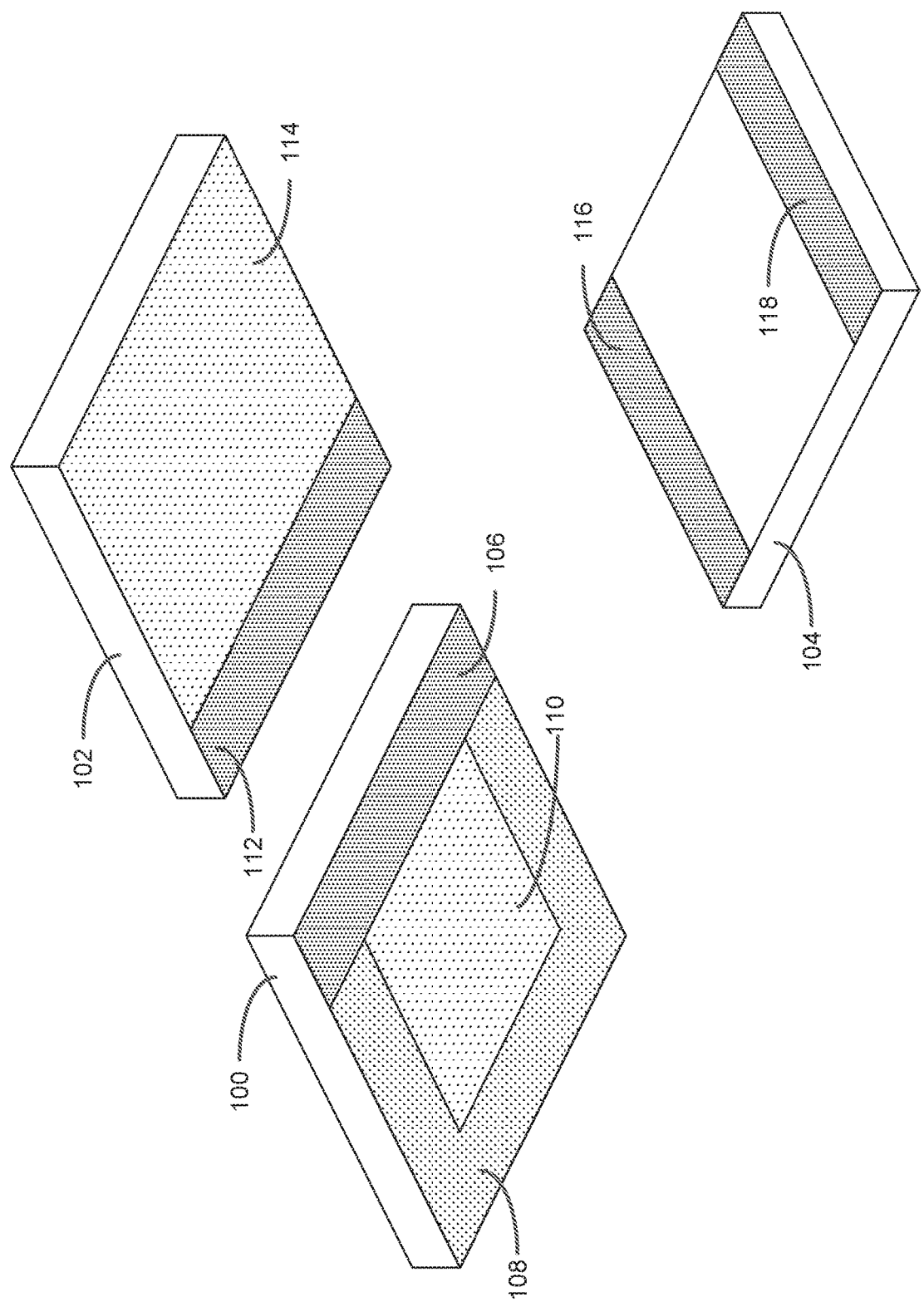
FIG. 1 illustrates microelectronic dies, according to some embodiments.

FIG. 1 illustrates microelectronic dies, according to some embodiments. The illustrated embodiments allow dense interconnects between dies in DCA type situations while still accommodating board pad size and line/space rules. FIG. 1 illustrates two dies 100 and 102, and an interconnecting bridge 104 suitable for interconnecting the two dies. Such a bridge may be, for example, a silicon bridge. In some embodiments one die, such as die 100, may be a processor die such as SOC, Central Processing Unit (CPU), Digital Signal Processor (DSP), Graphics Processing Unit (GPU), Advanced Processing Unit (APU), or other type of processor.

Die 100 has a high density interconnect 106. High density interconnect 106 has a low bump pitch to allow a high number of connections in a small area. In one example, the bump pitch is from about 30 μm to about 90 μm. A high density interconnect may be used to connect die 100 to another die where a high number of connections would be advantageous. An example would be where die 100 is a SOC and is connected through high density interconnect 106 to a memory die.

Die 100 may contain other connection regions spread around different parts of the die. In the illustrated embodiment, die 100 has connection region 108 around the remaining sides of the die and connection region 110 located more centrally. The bump pitch of connection region 108 and the bump pitch of connection region 110 allow DCA of die 100 to a circuit board. As such, the bump pitch of connection region 108 and the bump pitch of connection region 110 are sized to accommodate the pad size and line/space rules of the board. The bump pitch of connection region 108 may be the same as or different than the bump pitch of connection region 110, depending on the embodiment. This will result in bump pitch for connection region 108 and connection region 110 that is greater than the bump pitch of high density interconnect 106. Current design rules allow a spacing for a High Density Interconnect (HDI) type board that is no tighter than about 60 μm to about 75 μm.

When die 100 is a processor die, such as a SOC die, high density interconnect 106, which is located adjacent to one side, may house the memory connections. Other input/output connections may be contained in connection region 108, which is adjacent to the remaining three sides. Finally, power connections may be very sparsely populated (relatively) without affecting performance. Therefore, power connections may be more centrally located as in connection region 110. Additionally, or alternatively, some power connections may be interleaved in other regions as desired. In this example, the bump pitch of connection region 108 may be the same as, or different than, the bump pitch of connection region 110.

Die 102, which may be a memory die or some other type of die, also has a high density interconnect 112. High density interconnect 112 has a low bump pitch to allow a high number of connections in a small area. In one example, the bump pitch is from about 30 μm to about 90 μm. The bump pitch of high density interconnect 112 may match that of high density interconnect 106.

Die 102 may also have connection region. 114. In one example, die 102 is a memory die and connection region 114 contains power connections for the die. The bump pitch in connection region 114 may be sized to accommodate DCA of die 102 to a circuit board, such as a HDI type board. As such, the bump pitch of connection region 114 will be no tighter than about 60 μm to about 75 μm using current pad and line/space rules.

Interconnecting bridge 104 is a die designed to interconnect die 100 and die 102. To accomplish this, interconnecting bridge 104 has two high density interconnects, 116 and 118. The bump pitch of high density interconnect 116 is sized to match the bump pitch of high density interconnect 106, and the bump pitch of high density interconnect 118 is sized to match the bump pitch of high density interconnect 112. Typically the bump pitch of high density interconnect 116 will match that of high density interconnect 118, but different bump pitches may be used.

Figure 2:
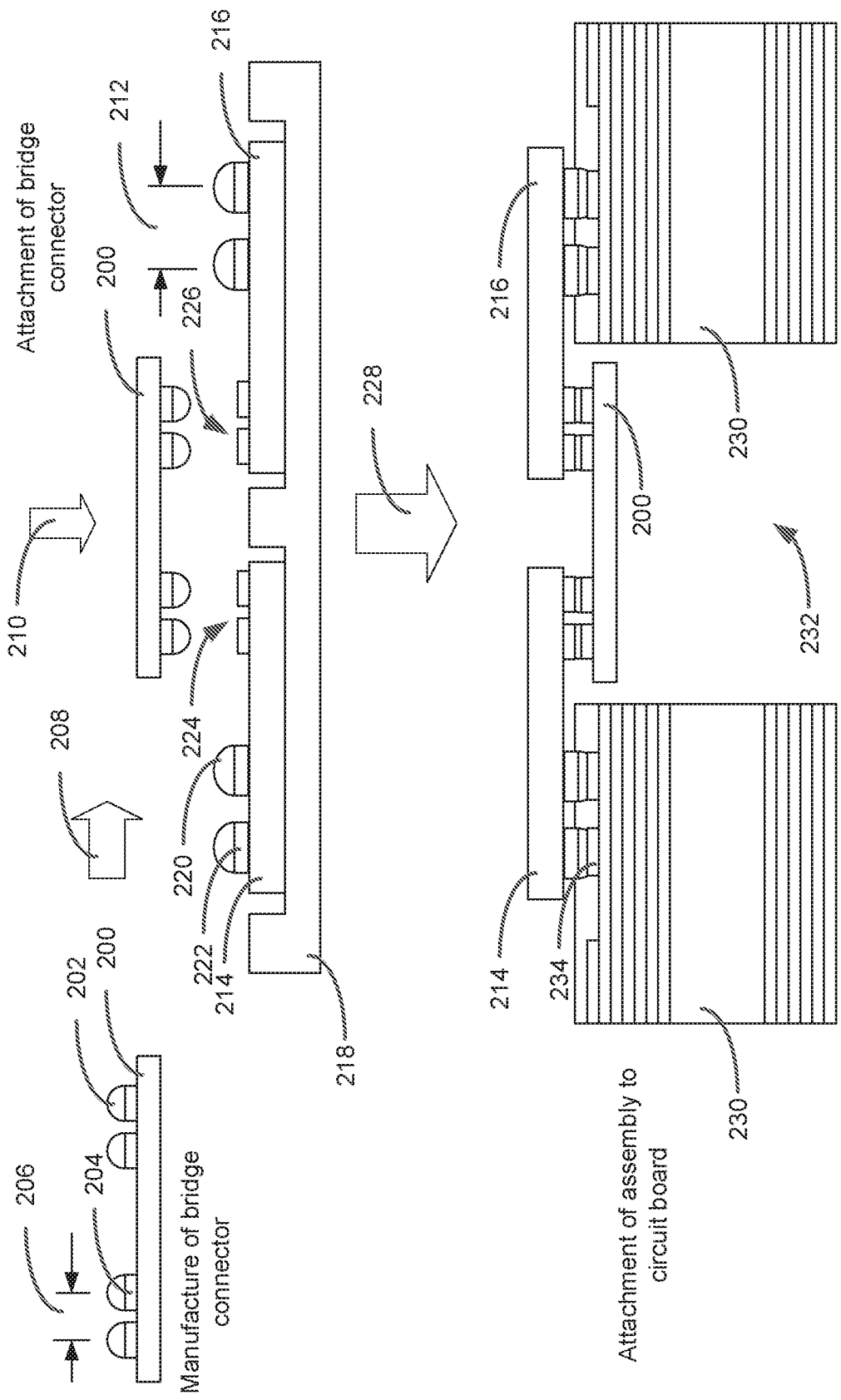
FIG. 2 illustrates a process to interconnect microelectronic dies and to mount interconnected microelectronic dies, according to some embodiments.

FIG. 2 illustrates a process to interconnect microelectronic dies and to mount interconnected microelectronic dies, according to some embodiments. In FIG. 2, the process begins with the manufacture of an interconnect bridge (e.g., a silicon bridge) 200. The bridge, such as bridge 104 of FIG. 1, has high density interconnects at its ends to interconnect dies, and appropriate interconnections between the two high density interconnects are made in order for the dies to be connected. The high density interconnects have connection pads (or bumps) 204, which have a bump pitch 206. As previously mentioned, the bump pitch for the high density interconnects may be the same or may be different, depending on the particular embodiment. As illustrated in FIG. 2, the connection mechanism such as solder on pads may be provided with higher temperature solder 202 (higher in comparison to 224) during the manufacturing process.

Once the interconnecting bridge 200 is manufactured, it may be used to interconnect other die. In FIG. 2, this transition is illustrated by arrow 208. In the particular example of FIG. 2, interconnecting bridge 200 will be used to interconnect die 214 and die 216. Die 214 and die 216 have high density interconnects located so that the distance between the high density interconnects may be bridged by interconnecting bridge 200 when they are correctly oriented. Specifically, in FIG. 2, the high density interconnects are located adjacent to an edge of the die, as illustrated by 224 and 226. The bump pitch of the high density interconnects is sized to match the corresponding high density interconnect of interconnecting bridge 200. Since interconnecting bridge 200 has previously been manufactured with high temperature solder 202 covering the connection pads of its high density interconnects, it is generally not necessary to provide the die's high density interconnects with high temperature solder, although this is simply an example.

Die 214 and die 216 also have a connection area with connection pads 222 with bump pitch 212. Connection pads 222 may also be provided with solder 220 during manufacture of die 214 and die 216 (or as part of a separate process). The bump pitch 212 is sized appropriately for attachment to a circuit board, as explained below. Although FIG. 2 illustrates all connection areas of both die 214 and die 216 having the same bump pitch, that is simply an example, and different connection areas within a die or different connection areas between dies may have different bump pitch.

Die 214 and die 216 may be placed in a carrier 218 and oriented so that their high density interconnects are located toward one another. Interconnecting bridge 200 is flipped and attached to die 214 and 216 through a bonding process, such as thermal compression bonding, solder reflow, and the like. This is illustrated by arrow 210.

After die 214 and die 216 are interconnected by interconnecting bridge 200, they may be mounted on a circuit board, such as a HDI type board. In FIG. 2, this transition is illustrated by arrow 228.

In FIG. 2, an appropriate board is illustrated by board 230. Board 230 is typically a HDI type board with multiple layers and microvias on the top one to three layers. In preparing the board, the high density interconnect may be called out specifically along with the connection points 234 (and their associated bump pitch) in the die (such as die 214 and die 216) that will directly attach to the board.

The circuit board may be prepared by creating a hole or recess where interconnecting bridge 200 will reside when the assembly is attached to the board. In FIG. 2 that hole is illustrated by 232. Although a hole between all layers of board 230 is illustrated, this is an example only. A recess sufficient to accommodate the interconnecting bridge may also be used.

The assembly of die 214, die 216, and interconnecting bridge 200 is flipped and attached to board 230 using a DCT technology, as illustrated in FIG. 2. In attaching the assembly to board 230, a solder melting temperature hierarchy may be maintained so that the solder joints of already bonded interfaces do not melt when later solder joints are made. If desired, a material, such as an epoxy or some other material, may be placed in hole 232 in order to provide mechanical support for interconnecting bridge 200, depending on the embodiment. Such mechanical support is, however, optional.

Using an interconnecting bridge 200 to interconnect die 214 and 216 can allow a very high density interconnection to be made between, for example, a SOC die and a memory die, while allowing greatly relaxed tolerances on circuit board production and assembly. Thus, the entire assembly can be mounted to the board 230 using Surface Mount Technology (SMT) because the board pitch can be, for example, from about 250 µm to about 400 µm while still maintaining tight bump pitch on the high density interconnects (for example, from about 30 µm to about 90 µm).

Figure 3:
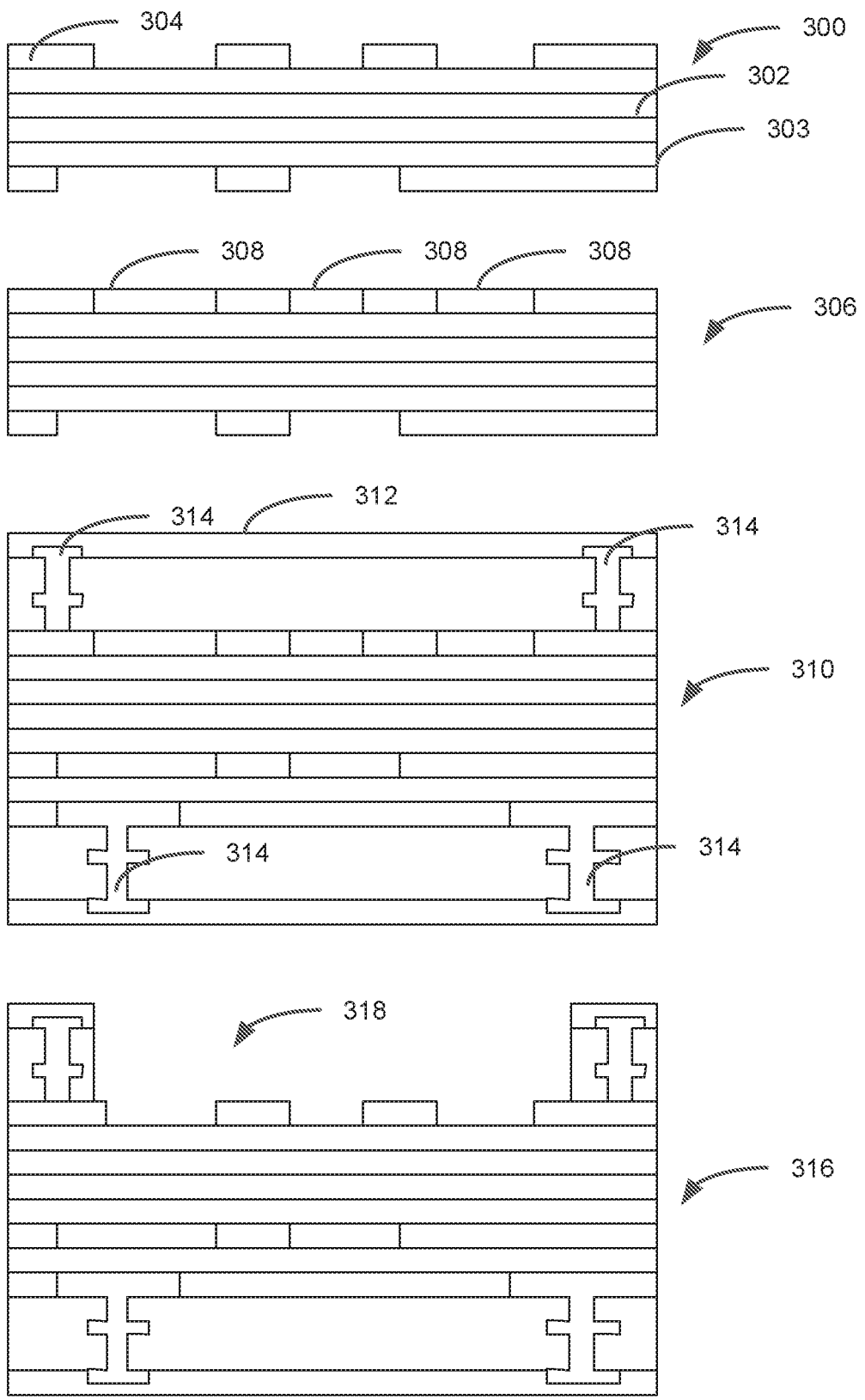
FIG. 3 illustrates a process to create a recess in a circuit board to receive a bridge, according to some embodiments.

FIG. 3 illustrates a process to create a recess in a circuit board to receive a bridge, according to some embodiments. The process begins as illustrated in 300 when planar copper is patterned with subtractive or semi-subtractive on the layer to be connected to the component along with other patterning. This can result in multiple layers 302 (typical) and various features, such as 304. In the figure, the bridge attachment side is shown at the top of the board 303.

In 306, a releasable layer 308 is applied through squeeze. The thickness of the layer 308 is approximately the same thickness as the copper of that layer.

In 310, subsequent layers are added to create various desired features, such as microvia 314, until solder resist layer 312 is applied, and all layers of the board are complete.

In 316, recess 318 is created by removing the buildup layers where the bridge is to reside. This can be accomplished through laser scribing or by using a photo sensitive material in the area, which is later to be removed, and then using light to remove the photo sensitive material. After the buildup layers are removed, the releasable layer is removed, and a de-smear process is used to clean out the remnants from the releasable layer.

The above detailed description includes references to the accompanying drawings, which form a part of the detailed description. The drawings show, by way of illustration, specific embodiments in which the disclosure may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," "third," and so forth are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments may be combined with each other in various combinations or permutations. The scope of the inventive material should be determined with reference to the appended claims, along with the full scope of equivalents to which such claims are entitled.

What is claimed is:

1. A method of assembling an interconnect device, comprising:
    assembling a first die and a second die to an interconnecting bridge, wherein
    the interconnecting bridge has a plurality of high density interconnects with a first bump pitch;
    wherein the first die has three connection regions including high density interconnects with the first bump pitch along a side of the first die;
    wherein the first die includes a connection region around remaining sides of the first die;
    wherein the first die includes a connection region located centrally on the first die;
    wherein the second die includes two connection regions including high density interconnects with the first bump pitch;
    wherein the second die includes a connection region with a bump pitch different from the high density interconnects with the first bump pitch;
    assembling the first die to a circuit board;
    removing a release layer and a buildup layer in the circuit board to form a recess; and
    locating the interconnecting bridge to reside in the recess.

2. The method of claim 1, further including assembling the second die to a circuit board.

3. The method of claim 1, further including assembling the second die to the circuit board.

4. The method of claim 1, further including:
    placing the first die and the second die in a carrier by orienting the high density interconnects for the first die and the second die toward each other; and
    bonding the interconnecting bridge to the first die and the second die by a process selected from solder reflow and thermocompression bonding.

5. The method of claim 1, further including:
    placing the first die and the second die in a carrier by orienting the high density interconnects for the first die and the second die toward each other;
    bonding the interconnecting bridge to the first die and the second die by a process selected from solder reflow and thermocompression bonding; and
    assembling the second die to the circuit board.

6. The method of claim 1, further including assembling the second die to the circuit board, further:
    wherein the circuit board has a bump pitch region to match the first bump pitch of the first die, a bump pitch;
    wherein the circuit board has a bump pitch region to match the connection region around remaining sides of the first die;
    wherein the circuit board has a bump pitch region to match the connection region located centrally on the first die;
    wherein the circuit board has a bump pitch region to match the high density interconnects of the second die; and
    wherein the circuit board has a bump pitch region to match the second die with a bump pitch different from the high density interconnects with the first bump pitch.

* * * * *

UNITED STATES PATENT AND TRADEMARK OFFICE
CERTIFICATE OF CORRECTION

PATENT NO. : 10,446,499 B2
APPLICATION NO. : 15/438321
DATED : October 15, 2019
INVENTOR(S) : Roy et al.

Page 1 of 1

It is certified that error appears in the above-identified patent and that said Letters Patent is hereby corrected as shown below:

On the Title Page

Item (60), in "Related U.S. Application Data", in Column 1, Line 1, delete "(60)" and insert --(62)-- therefor Signed and Sealed this
Fourteenth Day of July, 2020

Andrei Iancu
*Director of the United States Patent and Trademark Office*